(12) United States Patent  
Hong

(10) Patent No.: US 12,198,751 B2  
(45) Date of Patent: Jan. 14, 2025

(54) MEMORY DEVICE AND PRECHARGING METHOD THEREOF

(71) Applicant: Samsung Electronics Co., Ltd., Suwon-si (KR)

(72) Inventor: Seungki Hong, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 142 days.

(21) Appl. No.: 18/118,235

(22) Filed: Mar. 7, 2023

(65) Prior Publication Data

US 2024/0096398 A1 Mar. 21, 2024

(30) Foreign Application Priority Data

Sep. 16, 2022 (KR) .......................... 10-2022-0116930

(51) Int. Cl.
*G11C 16/34* (2006.01)
*G11C 11/406* (2006.01)
*G11C 11/408* (2006.01)
*G11C 11/4093* (2006.01)

(52) U.S. Cl.
CPC .... *G11C 11/4087* (2013.01); *G11C 11/40615* (2013.01); *G11C 11/4093* (2013.01)

(58) Field of Classification Search
CPC .................................................. G11C 16/454
USPC ......................................... 365/185.22, 185.2
See application file for complete search history.

(56) References Cited

U.S. PATENT DOCUMENTS

| | | |
|---|---|---|
| 5,774,409 A | 6/1998 | Yamazaki et al. |
| 5,940,342 A | 8/1999 | Yamazaki et al. |
| 6,233,195 B1 | 5/2001 | Yamazaki et al. |
| 6,381,188 B1 | 4/2002 | Choi et al. |
| 6,426,908 B1 | 7/2002 | Hidaka |
| 6,487,136 B2 | 11/2002 | Hidaka |
| 6,711,093 B1 | 3/2004 | Shore et al. |
| 7,660,184 B2 | 2/2010 | Kobayashi |
| 8,174,917 B2 | 5/2012 | Kobayashi |
| 8,630,138 B2 | 1/2014 | Kobayashi |
| 10,339,994 B2 | 7/2019 | Ito et al. |
| 2002/0031030 A1 | 3/2002 | Choi et al. |
| 2002/0105845 A1 | 8/2002 | Hidaka |

(Continued)

FOREIGN PATENT DOCUMENTS

| | | |
|---|---|---|
| KR | 100260288 B1 | 7/2000 |
| KR | 100327591 B1 | 3/2002 |

(Continued)

*Primary Examiner* — Jason Lappas  
(74) *Attorney, Agent, or Firm* — Muir Patent Law, PLLC

(57) ABSTRACT

A memory device and a method of precharging a decoded address are provided. The memory device includes a memory cell array comprising a plurality of rows; a row decoder configured to select a row to be activated from among the plurality of rows based on a decoded row address; and an interface circuit configured to: generate the decoded row address based on decoding a plurality of bits of a row address, transfer the decoded row address to the row decoder, in a first mode of the memory device, precharge the decoded row address that is transferred to the row decoder, and in a second mode of the memory device, determine whether a precharge signal is received in the second mode, and precharge the decoded row address based on the precharge signal.

20 Claims, 10 Drawing Sheets

(56) References Cited

U.S. PATENT DOCUMENTS

| | | |
|---|---|---|
| 2008/0037344 A1 | 2/2008 | Kobayashi |
| 2010/0091594 A1 | 4/2010 | Kobayashi |
| 2011/0085385 A1* | 4/2011 | Park .................... G11C 11/5628 |
| | | 365/185.2 |
| 2012/0195145 A1 | 8/2012 | Kobayashi |

FOREIGN PATENT DOCUMENTS

| | | |
|---|---|---|
| KR | 100355226 B1 | 10/2002 |
| KR | 100383503 B1 | 5/2003 |
| KR | 1020060020871 A | 3/2006 |
| KR | 1020070041956 A | 4/2007 |
| KR | 100893113 B1 | 4/2009 |

* cited by examiner

MEMORY DEVICE AND PRECHARGING METHOD THEREOF

CROSS-REFERENCE TO RELATED APPLICATION(S)

This application is based on and claims priority to Korean Patent Application No. 10-2022-0116930 filed in the Korean Intellectual Property Office on Sep. 16, 2022, the disclosure of which is incorporated herein by reference in its entirety.

BACKGROUND

1. Field

The disclosure relates to a memory device and a precharge method thereof.

2. Description of the Related Art

A memory device such as a dynamic random-access memory (DRAM) may include a plurality of rows, and select a row to be activated from among the rows based on a row address. The memory device may decode the row address and transfer the decoded row address to a row decoder that selects the row to be activated. In some modes of the memory device, there may be a state in which the decoded row address transferred to the row decoder is not determined. In this case, a mechanism (e.g., power-gating) that can reduce a power of a logic circuit may not be applied due to the undetermined state, and thus power consumption may increase. Therefore, it is desired to reduce power consumption by precharging the decoded row address in some modes of the memory device.

SUMMARY

One or more embodiments of the disclosure provide a memory device and a precharge method thereof for reducing power consumption.

According to an embodiment, there is provided a memory device including: a memory cell array comprising a plurality of rows; a row decoder configured to select a row to be activated from among the plurality of rows based on a decoded row address; and an interface circuit configured to: generate the decoded row address based on decoding a plurality of bits of a row address, transfer the decoded row address to the row decoder, in a first mode of the memory device, precharge the decoded row address that is transferred to the row decoder, and in a second mode of the memory device, determine whether a precharge signal is received in the second mode, and precharge the decoded row address based on the precharge signal.

According to an embodiment, there is provided a memory device including: a memory cell array including a plurality of rows; a row decoder configured to select a row to be activated from among a plurality of rows based on a decoded row address; a row address align circuit configured to align a plurality of bits of a row address based on an active command from a memory controller; and a latch circuit configured to: decode and latch the aligned row address, transfer the decoded row address to the row decoder, in a first mode of the memory device, precharge the decoded row address to a predetermined level in response to a precharge control signal, and in a second mode of the memory device, determine whether a precharge signal is received in the second mode, and precharge the decoded row address based on the precharge signal.

According to an embodiment, there is provided a method of precharging a memory device including a row decoder connected to a plurality of rows. The method includes: generating a decoded row address by decoding a plurality of bits of a row address; transferring the decoded row address to the row decoder; selecting a row to be activated from among the plurality of rows based on the decoded row address; based on the memory device being in a first mode, precharging the decoded row address to a predetermined level; and based on the memory device being in a second mode, determining whether a precharge signal is received, and precharging the decoded row address based on the precharge signal.

DETAILED DESCRIPTION

Figure 1:
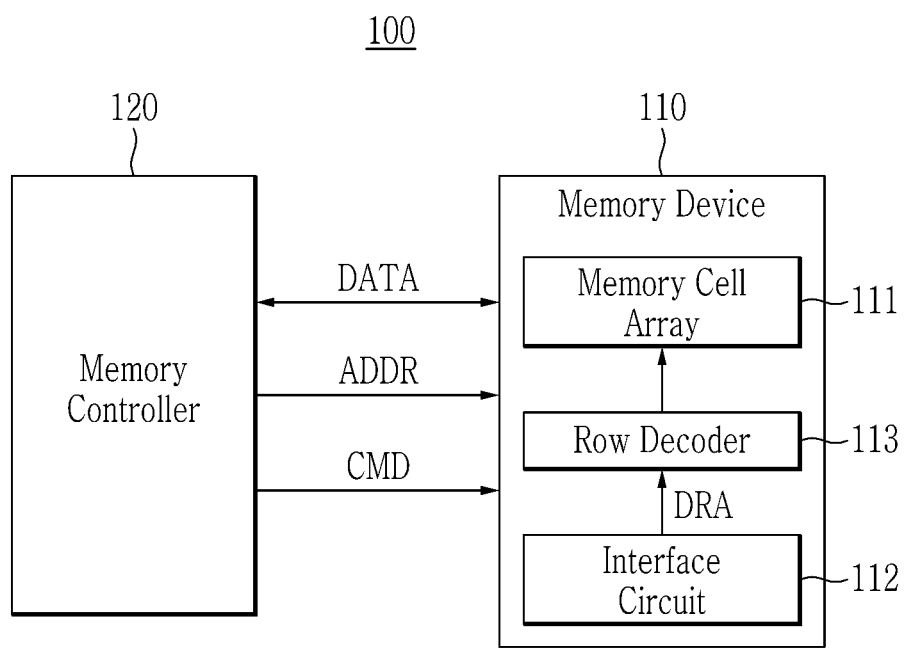
FIG. 1 is a block diagram showing an example of a memory system according to some embodiments.

In the following detailed description, only certain embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 is a block diagram showing an example of a memory system according to some embodiments.

Referring to FIG. 1, a memory system 100 may include a memory device 110 and a memory controller 120. In some embodiments, the memory device 110 and the memory controller 120 may be connected through a memory interface to send and receive signals through the memory interface.

The memory device 110 may include a memory cell array 111, an interface circuit 112, and a row decoder 113. The memory cell array 111 may include a plurality of banks, and each bank may include a plurality of memory cells defined by a plurality of rows and a plurality of columns. The rows may be defined by wordlines and the columns may be defined by bit lines. The interface circuit 112 may decode a plurality of bits of an incoming row address and output a decoded row address DRA. The row decoder 113 may select (i.e., open) a row to be activated from among the rows based on the decoded row address DRA. The interface circuit 112 may precharge the decoded row address DRA by setting the decoded row address DRA to be transferred to the row decoder 113 to a predetermined level in a predetermined mode of the memory device 110.

The memory controller 120 may control a memory operation of the memory device 110 by providing a signal to the memory device 110. The signal may include a command CMD and an address ADDR. In some embodiments, the memory controller 120 may provide the command CMD and the address ADDR to the memory device 110 to access the memory cell array 111 and control a memory operation such as read or write. Data may be transferred from the memory cell array 111 to the memory controller 120 according to a read operation, and data may be transferred from the memory controller 120 to the memory cell array 111 according to a write operation.

The command CMD may include an active command, a read/write command, a precharge command, and/or a refresh command. The active command may be a command for switching a target bank and/or a target row of the memory cell array 111 to an active state in order to write data to or read data from the memory cell array 111. The read/write command may be a command for performing the read or write operation on a target memory cell of the activated row. The precharge command may be a command for precharging or closing the activated bank. The refresh command may be a command for performing a refresh operation in the memory cell array 111.

In some embodiments, the memory controller 120 may access the memory device 110 in response to a request from a host external to the memory system 100. The memory controller 120 may communicate with the host using various protocols.

The memory device 110 may be a storage device based on a semiconductor device. In some embodiments, the memory device 110 may include a DRAM device. In some embodiments, the memory device 110 may include other volatile or non-volatile memory devices to which a precharge operation to be described below can be applied.

Figure 2:
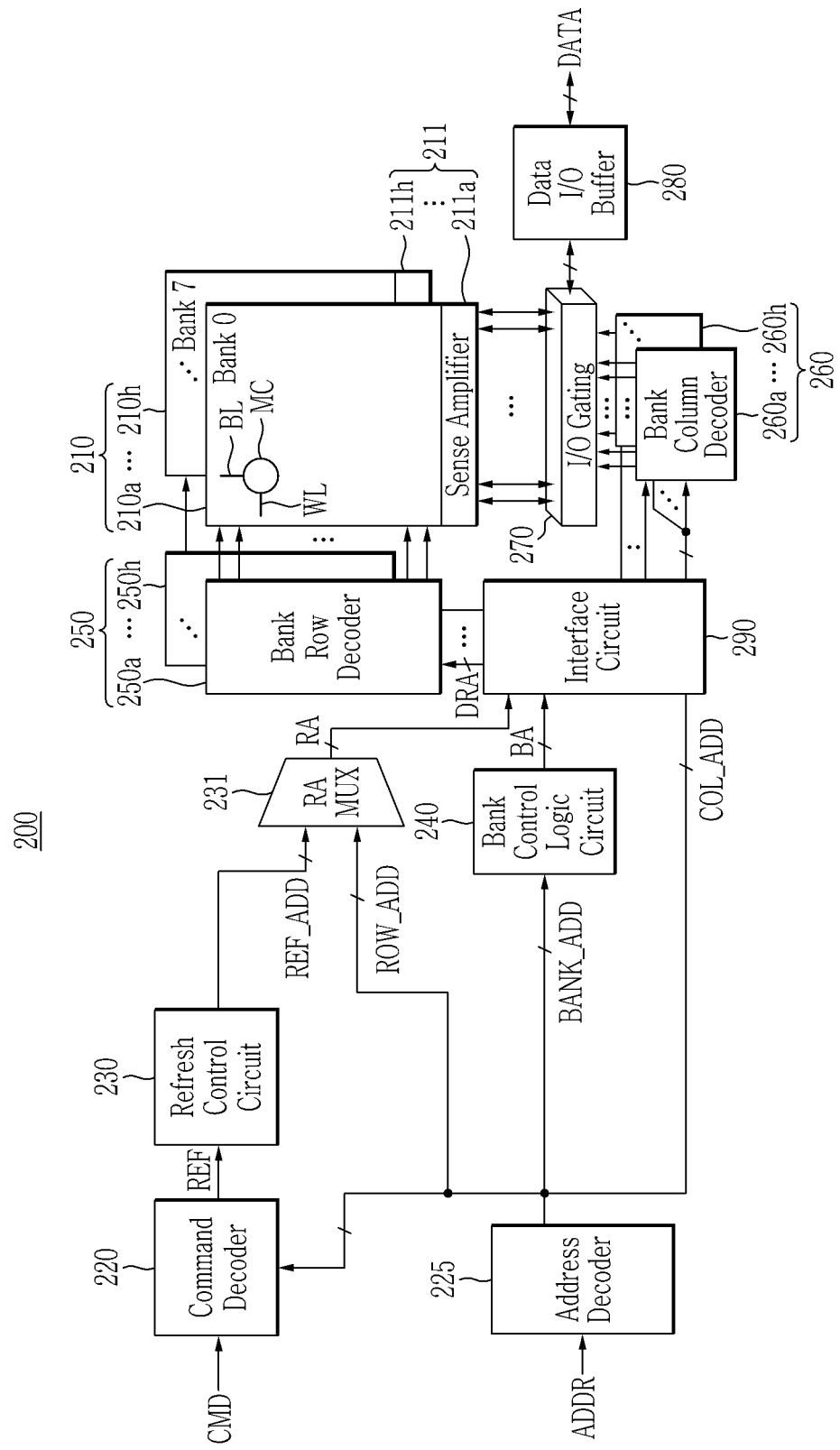
FIG. 2 is a block diagram showing an example of a memory device according to some embodiments.

FIG. 2 is a block diagram showing an example of a memory device according to some embodiments.

Referring to FIG. 2, a memory device 200 may include a memory cell array 210, a sense amplifier 211, a command decoder 220, an address decoder 225, a refresh control circuit 230, a row decoder 250, a column decoder 260, an input/output (I/O) gating circuit 270, a data I/O buffer 280, and an interface circuit 290.

The memory cell array 210 may include a plurality of memory cells MC. In some embodiments, the memory cell array 210 may include a plurality of memory banks 210a to 210h. Although FIG. 2 shows eight memory banks 210a to 210h (Bank 0 to Bank 7), the number of memory banks is not limited thereto. Each of the memory banks 210a to 210h may include a plurality of rows, a plurality of columns, and a plurality of memory cells MC arranged at intersections of the plurality of rows and the plurality of columns. In some embodiments, the rows may be defined by a plurality of wordlines WL, and the columns may be defined by a plurality of bitlines BL.

The command decoder 220 may generate a control signal so that the memory device 200 may perform a read operation, a write operation, a precharge operation, and/or a refresh operation. A command CMD received from a memory controller (e.g., 120 of FIG. 1) may include an active command, a read/write command, a precharge command, and/or a refresh command. In some embodiments, the command decoder 220 may generate a precharge signal as an internal signal of the memory device 200 in response to the precharge command. Further, the command decoder 220 may generate the precharge signal after performing a refresh.

The address decoder 225 may receive an address ADDR provided from the memory controller. The address ADDR may include a row address ROW_ADD indicating a row of the memory cell array 210 and a column address COL_ADD indicating a column of the memory cell array 210. In some embodiments, the address ADDR may further include a bank address BANK_ADD indicating a memory bank of the memory cell array 210.

The refresh control circuit 230 may output a refresh row address REF_ADD to be refreshed in response to the refresh command REF. In some embodiments, the refresh control circuit 230 may control various refreshes such as a self-refresh, a per-bank refresh, an all-bank refresh, and a targeted refresh. The targeted refresh may be, for example, a row hammer refresh. In some embodiments, the memory device 200 may further include a row address multiplexer 231. The row address multiplexer 231 may receive the row address ROW_ADD from the address decoder 225 and the refresh row address REF_ADD to be refreshed from the refresh control circuit 230. The row address multiplexer 231 may selectively output the row address ROW_ADD received from the address decoder 225 and the refresh row address REF_ADD received from the refresh control circuit 230 to the interface circuit 290.

The interface circuit 290 may decode the row address ROW_ADD received from the address decoder 225 or the refresh row address REF_ADD received from the refresh control circuit 230 to generate a decoded row address DRA. In some embodiments, the interface circuit 290 may decode the column address COL_ADD and provide the decoded column address to the column decoder 260. In some embodiments, a plurality of interface circuits 290 respectively corresponding to the memory banks 210a to 210h may be provided.

The row decoder 250 may select a row to be activated (i.e., a wordline to be activated) from among the rows of the memory cell array 210 based on the decoded row address DRA transferred from the interface circuit 290. In some embodiments, the row decoder 250 may transfer a control signal to a wordline driver of the wordline to be activated to drive the wordline driver. In some embodiments, the wordline driver may be a sub-wordline driver. In some embodiments, a plurality of bank row decoders 250a to 250h respectively corresponding to the memory banks 210a to 210h may be provided.

The column decoder 260 may select a column to be activated from the columns of the memory cell array 210 based on the decoded column address. The column decoder 260 may activate the sense amplifier 211 corresponding to the decoded column address through the I/O gating circuit 270. In some embodiments, a plurality of bank column decoders 260a to 260h respectively corresponding to the memory banks 210a to 210h may be provided. In some embodiments, the I/O gating circuit 270 may gate I/O data, and may include a data latch circuit that stores data read from the memory cell array 210 and a write driver that writes data to the memory cell array 210. The data read from the memory cell array 210 may be sensed by the sense amplifier 211 and stored in the I/O gating circuit 270 (e.g., the data latch circuit). In some embodiments, a plurality of sense amplifiers 211a to 211h respectively corresponding to the memory banks 210a to 210h may be provided.

In some embodiments, the memory device 200 may further include a bank control logic circuit 240 that generates a bank control signal BA in response to the bank address BANK_ADD. In response to the bank control signal transferred through the interface circuit 290, a bank row decoder corresponding to the bank address BANK_ADD among the bank row decoders 250a to 250h may be activated, and a bank column decoder corresponding to the bank address BANK_ADD among the bank column decoders 260a to 260h may be activated.

In some embodiments, the data read from the memory cell array 210 (e.g., the data stored in the data latch circuit) may be provided to the memory controller 120 via the data I/O buffer 280. The data to be written to the memory cell array 210 may be provided from the memory controller to the data I/O buffer 280, and the data provided to the data I/O buffer 280 may be provided to the I/O gating circuit 270.

Figure 3:
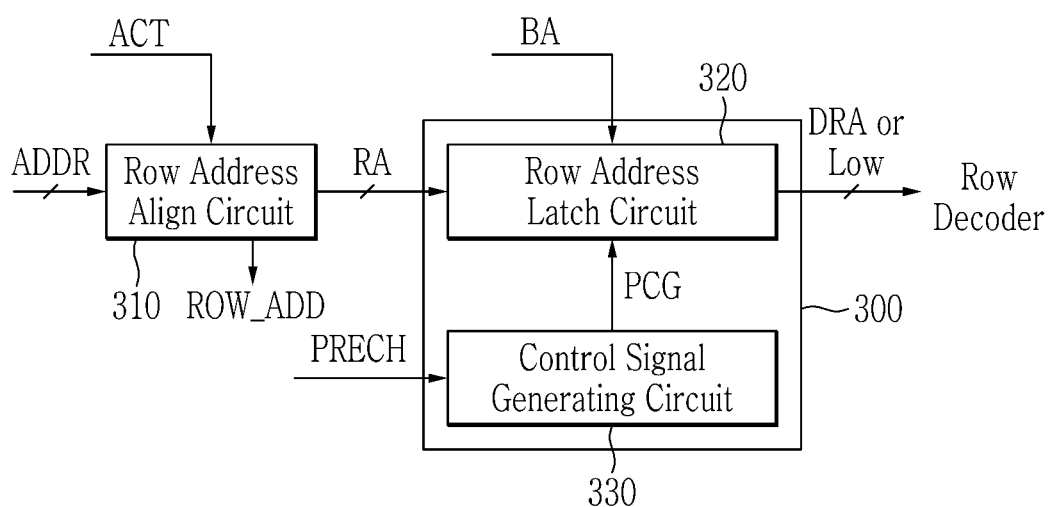
FIG. 3 is a block diagram showing an example of an interface circuit of a memory device according to some embodiments.
Figure 4:
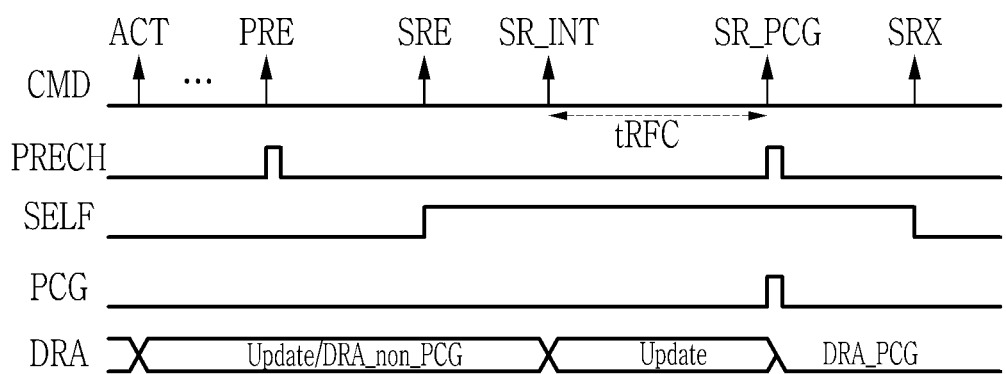
FIG. 4 and FIG. 5 each is a drawing showing an example of an operation of a memory device according to some embodiments.
Figure 5:
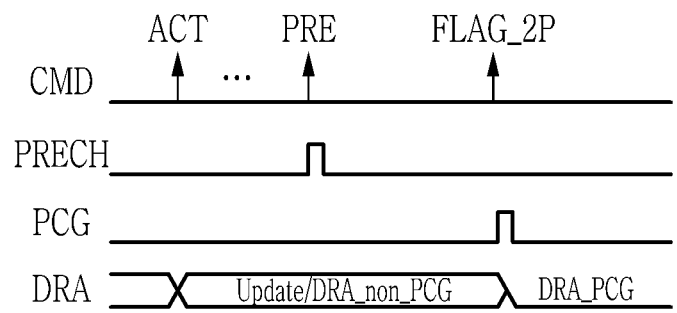

FIG. 3 is a block diagram showing an example of an interface circuit of a memory device according to some embodiments, and FIGS. 4 and 5 each is a drawing showing an example of an operation of a memory device according to some embodiments.

Referring to FIG. 3, an interface circuit 300 may include a row address latch circuit 320 and a control signal generating circuit 330.

The interface circuit 300 may receive a row address RA from a row address multiplexer (e.g., 231 of FIG. 2). In some embodiments, the address decoder 225 may include a row address align circuit 310. The row address align circuit 310 may align a plurality of bits of the row address ROW_ADD included in an address ADDR based on an active command ACT.

The row address latch circuit 320 may decode the bits of the row address RA aligned by the row address align circuit 310 to generate a decoded row address. The row address latch circuit 320 may decode the bits of the input row address RA in response to a control signal (or first control signal) input to a set terminal of the row address latch circuit 320, and latch and output the decoded row address DRA. The control signal input to the set terminal may be a bank address signal BA indicating a memory bank corresponding to the interface circuit 300. In some embodiments, the row address latch circuit 320 may decode the row address RA to generate the decoded row address DRA having a bit value of each bit of the row address RA and a decoded row address DRA having a complementary bit value of each bit of the row address RA. In some embodiments, the row address align circuit 310 may provide the aligned row address ROW_ADD to the row address multiplexer 231, and the row address latch circuit 320 may latch and output the decoded row address DRA. Further, the row address latch circuit 320 may precharge an output (i.e., decoded row address) by setting the output to a predetermined level in response to a precharge control signal (or second control signal) PCG input to a reset terminal of the row address latch circuit 320. In some embodiments, the predetermined level may be a low level ('0') as a logic level. Therefore, in response to the precharge control signal PCG, for example, a signal line and a logic gate to which the decoded row address DRA is transferred in a row decoder (e.g., 250 of FIG. 2) may be precharged to the predetermined level.

The control signal generating circuit 330 may generate the precharge control signal PCG in a predetermined mode among various modes of a memory device (e.g., 110 in FIG. 1 or 200 in FIG. 2). In some embodiments, the control signal generating circuit 330 may generate the precharge control signal PCG in response to a precharge signal PRECH in the predetermined mode. The precharge signal PRECH may be an internal signal of the memory device corresponding to a precharge command, and may be a signal (i.e., command) used to precharge or close an activated bank. In some embodiments, the memory device, for example, a command decoder (e.g., 220 of FIG. 2) may generate the precharge signal PRECH. In this case, the predetermined mode may include a self-refresh mode (or second mode) for the memory device to perform a self-refresh operation.

In some embodiments, the predetermined mode may include a precharge power-down mode (or first mode) in which all banks of the memory device are closed or precharged among various power-down modes. The precharge power-down mode may be referred to as an "IDD2P mode" or a "2P mode". Here, the "IDD2P" mode or "2P" mode may refer to a precharge standby current according to Joint Electron Device Engineering Council (JEDEC) standard. Hereinafter, the precharge power-down mode is described as the 2P mode. The control signal generating circuit 330 may generate the precharge control signal PCG in response to a 2P flag signal that is set as the memory device enters the 2P mode.

Referring to FIGS. 3 and 4, the memory device may receive various commands CMD from a memory controller (e.g., 120 of FIG. 1). The memory device may receive the address ADDR together with an active command ACT, and accordingly, the row address ROW_ADD of the row address align circuit 310 may be updated. In some embodiments, the memory device (e.g., command decoder) may generate the precharge signal PRECH in response to the precharge command PRE. In some embodiments, when the memory device is in a normal mode (e.g., access mode) in which the active command ACT (e.g., a first active command ACT1) is received, the control signal generating circuit 330 may not generate the precharge control signal PCG from the precharge signal PRECH. In some embodiments, when the memory device is in a mode in which a per-bank refresh, an all-bank refresh, or a targeted refresh is performed, the control signal generating circuit 330 may not generate the precharge control signal PCG from the precharge signal PRECH. Accordingly, the interface circuit 300 may not precharge the updated decoded row address DRA (DRA_non_PCG).

Further, the memory device may enter a self-refresh mode SELF in response to a self-refresh enter command SRE. The memory device may receive the self-refresh enter command SRE from, for example, the memory controller. The memory device (e.g., command decoder) may generate an internal signal including a self-refresh initiate command SR_INT and a self-refresh precharge command SR_PCG in the self-refresh mode SELF. In this case, the row address RA of the row address align circuit 310 may be updated in response to the self-refresh initiate command SR_INT. The self-refresh precharge command SR_PCG may be generated after a refresh cycle time tRFC elapses from the self-refresh initiate command SR_INT. The memory device (e.g., command decoder) may generate the precharge signal RPECH corresponding to the self-refresh precharge command SR_PCG. The control signal generating circuit 330 may generate the precharge control signal PCG in response to the precharge signal PRECH in the self-refresh mode SELF. The interface circuit 300 may precharge the decoded row address DRA to the predetermined level in response to the precharge control signal PCG (DRA_PCG). When a self-refresh exit command SRX is received, the memory device may exit from the self-refresh mode SELF in response to the self-refresh exit command SRX.

When an active command ACT (e.g., a second active command ACT2 following a first active command ACT1) is received from the memory controller 120, the row address RA of the row address align circuit 310 may be updated in response to the second active command ACT2. In this case, as described above, the interface circuit 300 may not precharge the updated decoded row address.

Referring to FIGS. 3 and 5, when an active command ACT (e.g., a second active command ACT2) is received from the memory controller, the row address ROW_ADD of the row address align circuit 310 may be updated in response to the active command ACT (e.g., ACT2). In this case, as described with reference to FIGS. 3 and 4, the interface circuit 300 may not perform a precharge operation on the updated decoded row address DRA (DRA_non_PCG).

The memory device may enter the 2P mode under a predetermined condition. For example, in a state in which all banks of the memory device are closed and precharged, the memory device may enter the 2P mode by setting a clock enable (CKE) to a low level by the memory controller. When the memory device enters the 2P mode, the memory device (e.g., command decoder) may generate a 2P flag signal FLAG_2P as an internal signal of power-down entry (PDE). In some embodiments, the control signal generating circuit 330 may receive the 2P flag signal FLAG_2P and generate the precharge control signal PCG in response to the 2P flag signal FLAG_2P. Thus, the interface circuit 300 may precharge the decoded row address DRA to the predetermined level in response to the precharge control signal PCG (DRA_PCG).

When the decoded row address DRA is precharged, a current may increase by toggling of the decoded row address due to the precharge, and thus power consumption may increase. However, if the decoded row address is not precharged, because statuses of logic circuits such as inverters (e.g., 811 to 818 in FIG. 8) positioned on a path to which the decoded row address is delivered in the self-refresh mode may be unknown, the memory device 110 may not perform power-gating. Here, the power-gating may be a technique to reduce power consumption (e.g., current) of the memory device by electrically disconnecting the circuit from a power source and/or the ground using, for example, a power switch. If the power-gating is not performed, an off-current may occur even when a transistor is in an off-state. In the self-refresh mode in which the power-down state in which all banks are closed (i.e., not activated) is maintained for a long time, the off-current may be greater than the current generated by the toggling. That is, compared to a case of precharging the decoded row address, a current (e.g., self-refresh current IDD6 according to JEDEC standard) in the self-refresh mode in a case of not precharging the decoded row address becomes larger, resulting in the increased power consumption. Accordingly, as in embodiments described with reference to FIG. 3 and FIG. 4, the power consumption can be reduced by precharging the decoded row address in the self-refresh mode. In some embodiments, as described with reference to FIG. 3 and FIG. 5, the power consumption can be reduced by precharging the decoded row address in the 2P mode in which the power-down state of closing all banks continues.

Figure 6:
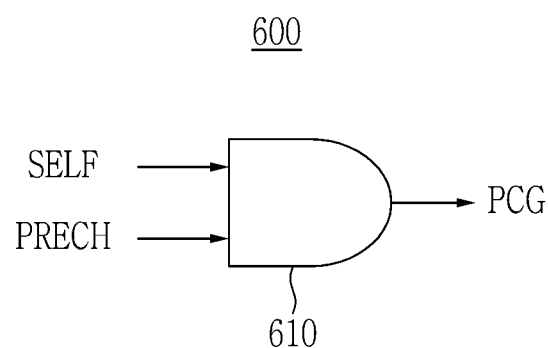
FIG. 6 is a drawing showing an example of a control signal generating circuit in an interface circuit according to some embodiments.

FIG. 6 is a drawing showing an example of a control signal generating circuit in an interface circuit according to some embodiments.

Referring to FIG. 6, a control signal generating circuit 600 may include a logic circuit 610. The control signal generating circuit 600 may correspond to the control signal generating circuit 330 of FIG. 3. The logic circuit 610 may receive a self-refresh flag SELF indicating a self-refresh mode and a precharge signal PRECH, and perform a logical operation on the self-refresh flag SELF and the precharge signal PRECH to generate a precharge control signal PCG. In some embodiments, the logic circuit 610 may generate the precharge control signal PCG having an enable level when both the self-refresh flag SELF and the precharge signal PRECH have the enable level. In some embodiments, the logic circuit 610 may include an AND gate 610 that perform an AND operation on the self-refresh flag SELF and the precharge signal PRECH. For example, when the self-refresh flag SELF and the precharge signal PRECH have a high level as the enable level, the logic circuit 610 may output the precharge control signal PCG having the high level.

Therefore, the control signal generating circuit 600 may generate the precharge control signal PCG in response to the precharge signal PRECH in the self-refresh mode, and the interface circuit (e.g., 300 in FIG. 3) may precharge a decoded row address to a predetermined level in response to the precharge control signal PCG.

Figure 7:
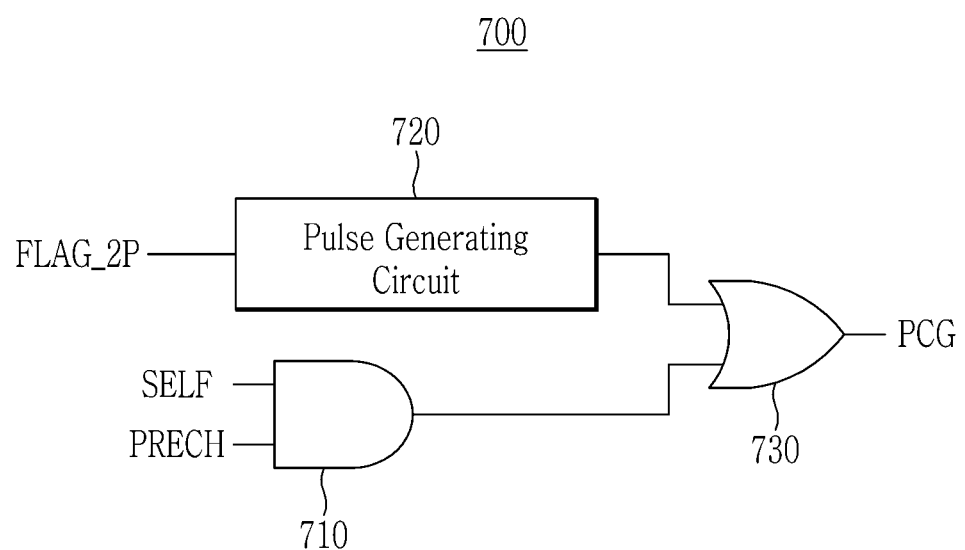
FIG. 7 is a drawing showing an example of a control signal generating circuit in an interface circuit according to some embodiments.

FIG. 7 is a drawing showing an example of a control signal generating circuit in an interface circuit according to some embodiments.

Referring to FIG. 7, a control signal generating circuit 700 may include logic circuits 710 and 730, and a pulse generating circuit 720. The control signal generating circuit 700 may correspond to the control signal generating circuit 330 of FIG. 3. The logic circuit 710 may receive a self-refresh flag SELF indicating a self-refresh mode and a precharge signal PRECH, and may perform a logical operation (e.g., a logic AND operation) on the self-refresh flag SELF and the precharge signal PRECH. The pulse generating circuit 720 may generate a pulse in response to a 2P flag signal FLAG_2P. In some embodiments, the pulse generating circuit 720 may generate the pulse having a predetermined width in response to a predetermined timing of the 2P flag signal FLAG_2P. The predetermined timing may be, for example, a time point at which the 2P flag signal FLAG_2P is generated. The logic circuit 730 may generate the precharge control signal PCG by performing a logical operation (e.g., a logic OR operation) on an output of the logic circuit 710 and the output pulse of the pulse generating circuit 720.

In some embodiments, the logic circuit 710 may output a signal having an enable level when both the self-refresh flag SELF and the precharge signal PRECH have the enable level. Here, the enable level may refer to a logic level having a high ("1") state. For example, when the self-refresh flag SELF and the precharge signal PRECH have a high level as the enable level, the logic circuit 710 may include an AND gate 710 that performs an AND operation on the self-refresh flag SELF and the precharge signal PRECH to output an output signal having the high level. In some embodiments, the logic circuit 730 may output the precharge control signal PGC having the enable level when the output signal of the logic circuit 710 or the output pulse of the pulse generating circuit 720 has the enable level. In some embodiments, the logic circuit 730 may include an OR gate 730 that performs an OR operation on the output signal of the logic circuit 710 and the output pulse of pulse generating circuit 720. For example, when the output of the logic circuit 710 and the output pulse of the pulse generating circuit 720 have the high level as the enable level, the logic circuit 730 may output the precharge control signal PCG having the high level. In addition, when either one of the output of the logic circuit 710 or the output of the pulse generating circuit 720 is at a logic high level, the precharge control signal PCG may have a high level. For example, when the memory device is in a self-refresh mode or in a precharge power-down mode ("2P mode"), the interface circuit 300 may precharge the decoded row address DRA to the predetermined level in response to the precharge control signal PCG (DRA_PCG).

Therefore, the control signal generating circuit 700 may generate the precharge control signal PCG in response to the precharge signal PRECH in self-refresh mode, and/or generate the precharge control signal PCG in response to the 2P flag signal FLAG_2P in the 2P mode. The interface circuit (e.g., 300 of FIG. 3) may precharge the decoded row address to the predetermined level in response to the precharge control signal PCG.

Figure 8:
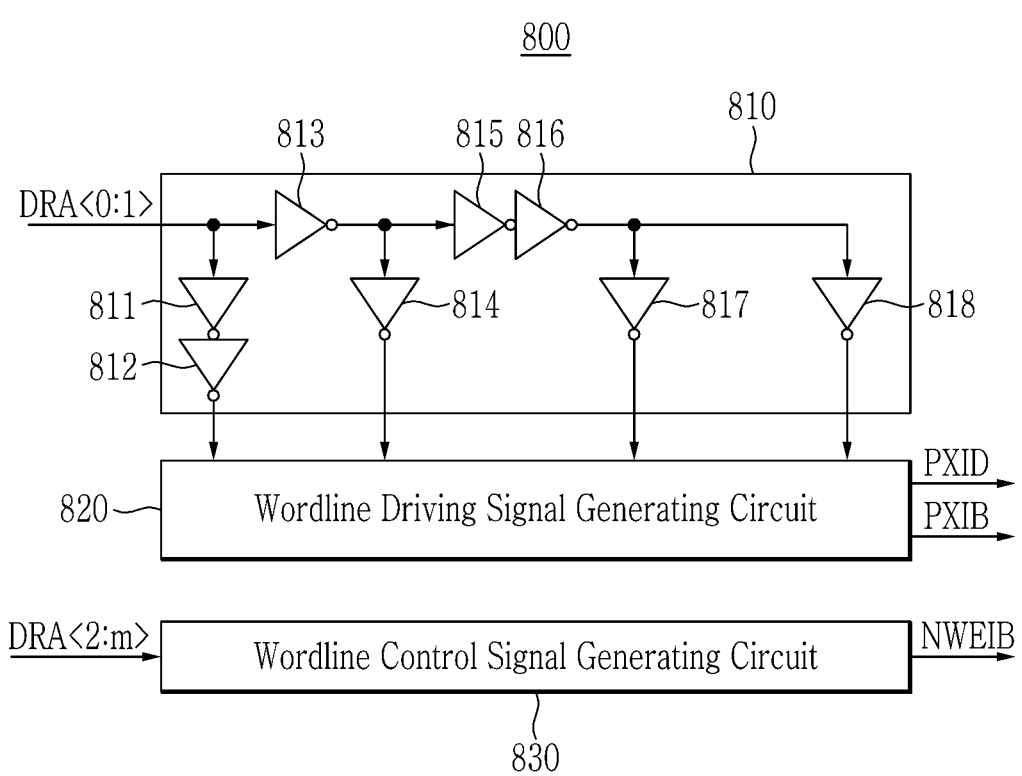
FIG. 8 is a drawing showing an example of a row decoder in a memory device according to some embodiments.
Figure 9:
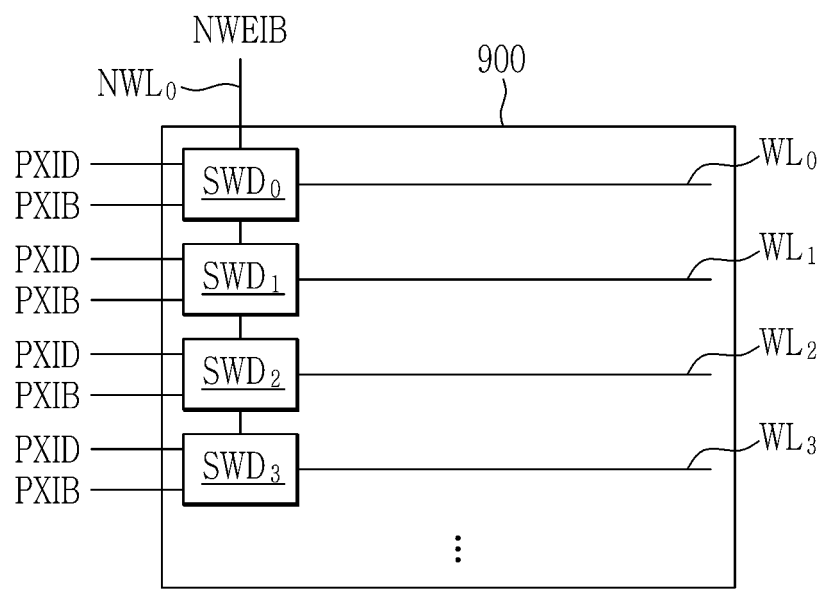
FIG. 9 is a drawing showing an example of a memory cell array in a memory device according to some embodiments.
Figure 10:
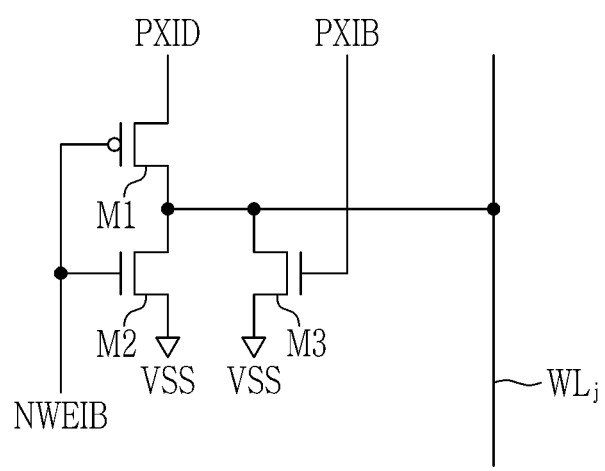
FIG. 10 is a drawing showing an example of a sub-wordline driver in a memory device according to some embodiments.

Referring to FIG. 8 to FIG. 10, precharge of a decoded row address is described by using an example of a memory device.

FIG. 8 is a drawing showing an example of a row decoder in a memory device according to some embodiments, FIG. 9 is a drawing showing an example of a memory cell array in a memory device according to some embodiments, and FIG. 10 is a drawing showing an example of a sub-wordline driver in a memory device according to some embodiments.

Referring to FIG. 8, a row decoder 800 may include a delivery circuit 810, a wordline driving signal generating circuit 820, and a wordline control signal generating circuit 830. Referring to FIG. 9, a memory cell array 900 may include a plurality of wordlines, a plurality of normal wordlines, and a plurality of sub-wordline drivers that drive the plurality of wordlines, respectively. For convenience, FIG. 9 shows only four wordlines $WL_0$ to $WL_3$ among the plurality of wordlines, one normal wordline $NWL_0$ among the plurality of normal wordlines, and four sub-wordline drivers $SWD_0$ to $SWD_3$. As shown in FIG. 9, the wordlines $WL_0$ to $WL_3$ may be branched from one normal wordline $NWL_0$ through sub-wordline drivers $SWD_0$ to $SWD_3$. FIG. 9 shows an example in which the four wordlines $WL_0$ to $WL_3$ are branched from one normal wordline $NWL_0$.

The delivery circuit 810 may receive the decoded row address. In some embodiments, the delivery circuit 810 may receive the decoded row address DRA<0:1> into which a predetermined number (e.g., two) of lowest bits RA<0:1> in the row address RA are decoded. The delivery circuit 810 may include, for example, a plurality of inverters 811, 812, 813, 814, 815, 816, 817, and 818. The delivery circuit 810 may output the decoded row address DRA<i> to the wordline driving signal generating circuit 820 via the inverters 811 and 812, and output the decoded row address DRA<i> to the wordline driving signal generating circuit 820 via the inverters 813 and 814. Here, i is 0 or 1. In addition, the delivery circuit 810 may output the decoded row address DRA<i> to the wordline driving signal generating circuit 820 via the inverters 813, 815, 816, and 817, and output the decoded row address DRA<i> to the wordline driving signal generating circuit 820 via the inverters 813, 815, 816, and 818. In some embodiments, the outputs of inverters 812, 814, 817, and 818 may be transferred to a control circuit that controls spare wordlines. Herein, the spare wordlines may be connected to a plurality of spare memory cells included in the memory cell array 111, 210, or 900 of FIG. 1, FIG. 2, or FIG. 9, respectively.

In this case, when the decoded row address DRA<i> is not precharged, a status of the decoded row address DRA<i> may not be determined. In a case where the status of the decoded row address DRA<i>, i.e., statuses of inputs of the inverters 811 to 818 are not determined, power-gating may not be applied to the inverters 811 to 818. As a result, because of a low threshold voltage of transistors forming the inverters 811 to 818, an off-current may flow through the transistors in an off-state. Therefore, as in the above-described embodiments, precharging the decoded row address DRA<i> to the predetermined level, for example, a logic level of a low level can allow power-gating to be applied to the inverters 811 to 818, thereby preventing the off-current.

The wordline driving signal generating circuit 820 may generate wordline driving signals PXID and PXIB based on the decoded row address DRA<0:1> received through the delivery circuit 810. In some embodiments, when the decoded row address DRA<0:1> decoded from two lowest bits RA<0:1> is received, the delivery circuit 810 may transfer four pairs of decoded row addresses DRA<0:1> to the wordline driving signal generating circuit 820. In this case, the wordline driving signal generating circuit 820 may generate four pairs of wordline driving signals PXID and PXIB (e.g., 4-bit PXID and 4-bit PXIB).

The wordline control signal generating circuit 830 may receive the decoded row address DRA<2:m> into which bits RA<2:m> except for the lowest bits RA<0:1> in the row address RA are decoded. Here, m is an integer greater than or equal to 3. The wordline control signal generating circuit 830 may generate a normal wordline enable signal NWEIB for enabling a normal wordline $NWL_0$ corresponding to the decoded row address DRA<2:m> among the plurality of normal wordlines based on the decoded row address DRA<2:m>. The normal wordlines may be connected to the plurality of memory cells included in the memory cell array 111, 210, or 900 of FIG. 1, FIG. 2, or FIG. 9, respectively.

Each sub-wordline driver $SWD_j$ may be connected to the normal wordline $NWL_0$ and the corresponding wordline $WL_j$, and may drive the connected wordline $WL_j$ in response to the normal wordline enable signal NWEIB and the wordline driving signals PXID and PXIB.

As shown in FIG. 10, each sub-wordline driver $SWD_j$ may include, for example, transistors M1, M2, and M3. The transistor M1 may be a p-channel metal oxide semiconductor (PMOS) transistor, and the transistors M2 and M3 may be n-channel metal oxide semiconductor (NMOS) transistors. A source of the transistor M1 may be connected to a line for transferring the wordline driving signal PXID, and sources of the transistors M2 and M3 may be connected to a power source VSS. Drains of the transistors M1, M2, and M3 may be connected to the wordline $WL_j$. The power source VSS may a terminal having a potential corresponding to a low level, and may be, for example, a ground terminal. In some embodiments, the sources of the transistors M2 and M3 may be connected to a negative voltage less than the ground VSS. The normal wordline enable signal NWEIB may be applied to gates of transistors M1 and M2, and the wordline driving signal PXIB may be applied to a gate of transistor M3. Accordingly, the sub-wordline driver $SWD_j$ may drive the wordline $WL_j$ according to logic levels of the normal wordline enable signal NWEIB and the wordline driving signals PXID and PXIB.

Figure 11:
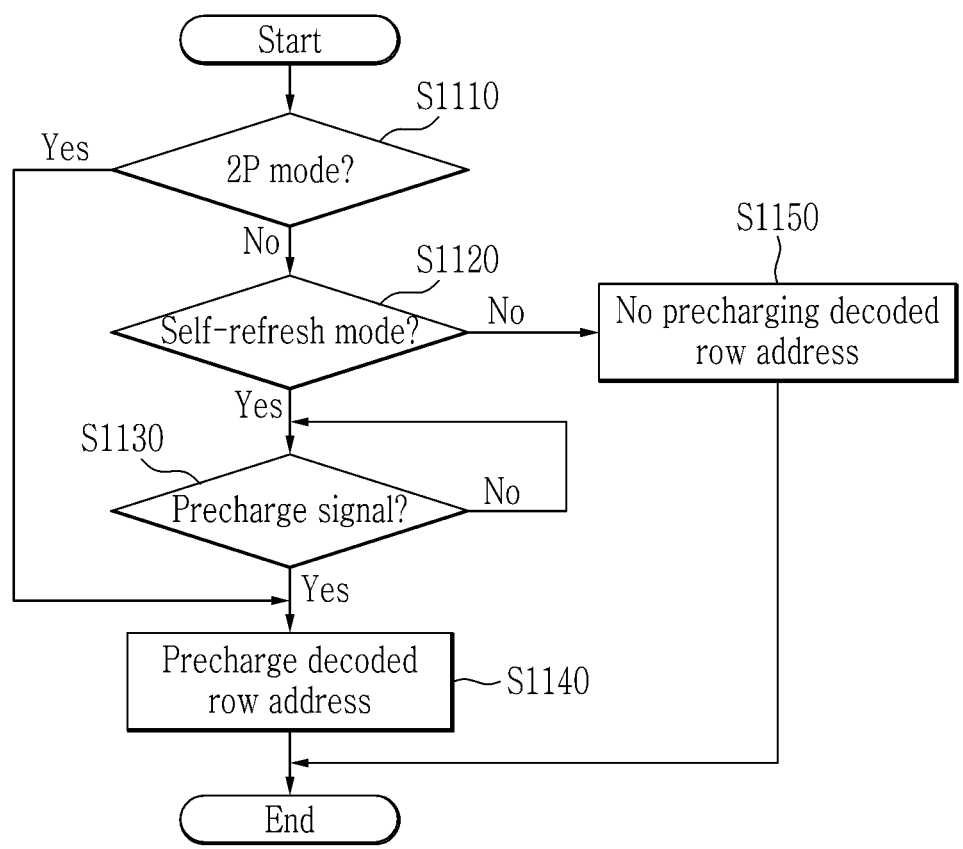
FIG. 11 is a flowchart showing an example of a method of precharging a decoded row address according to some embodiments.

FIG. 11 is a flowchart showing an example of a method of precharging a decoded row address according to some embodiments.

Referring to FIG. 11, a memory device may determine whether the current mode is a first mode (S1110). For example, the first mode may be a 2P mode or IDD2P mode. If the current mode is the first mode (S1110: Yes), the memory device may precharge the decoded row address in S1140. In some embodiments, the memory device may precharge the decoded row address at a time when the 2P flag signal is generated as the memory device enters the 2P mode. When the current mode is not in the 2P mode (S1110: No), the memory device may determine whether the current mode is a second mode (S1120). For example, the second mode may be a self-refresh mode. If the current mode is the second mode (S1120: Yes), the memory device may determine whether a precharge signal is received (S1130). If the precharge signal is received in the second mode (S1130: Yes), the memory device may precharge a decoded row address in response to a precharge signal (S1140). In some embodiments, the memory device may precharge the decoded row address by setting the decoded row address to be transferred to a row decoder to a predetermined level. In some embodiments, the precharge signal may be an internal signal of the memory device corresponding to a precharge command used to close or precharge a bank. For example, power consumption of the bank may be reduced when the bank is closed or precharged (e.g., inactivated). When the current mode is not in the second mode (S1120: No), the memory device may not precharge the decoded row address regardless of the precharge signal (S1150).

Figure 12:
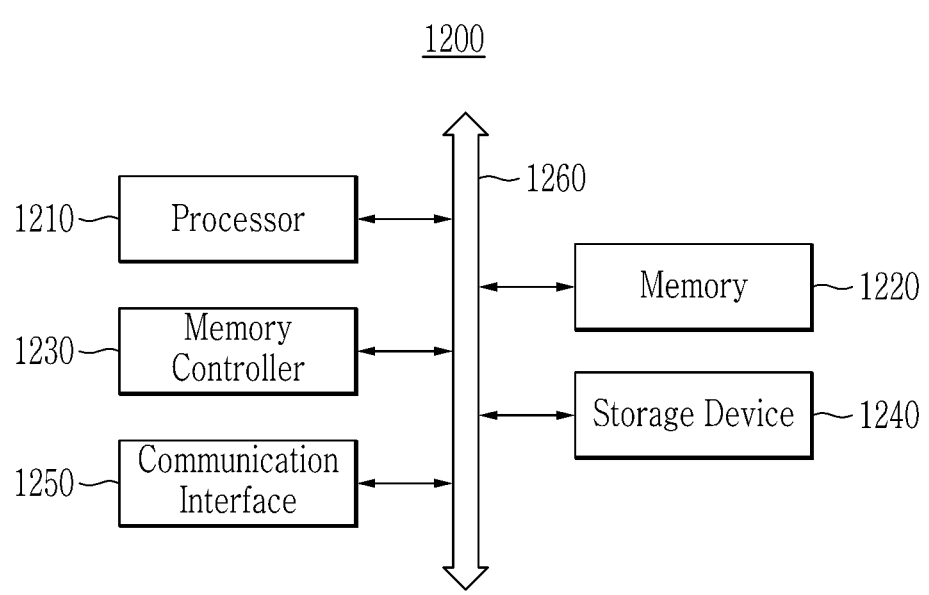
FIG. 12 is a block diagram showing an example of a computing device according to some embodiments.

FIG. 12 is a block diagram showing an example of a computing device according to some embodiments.

Referring to FIG. 12, a computing device 1200 may include a processor 1210, a memory 1220, a memory controller 1230, a storage device 1240, a communication interface 1250, and a bus 1260. The computing device 1200 may further include other components.

The processor 1210 may control an overall operation of each component of the computing device 1200. The processor 1210 may be implemented with at least one of various processing units such as a central processing unit (CPU), an application processor (AP), and a graphic processing unit (GPU).

The memory 1220 may store various data and instructions. The memory 1220 may be implemented with the memory device described herein with reference to FIG. 1 to FIG. 11. The memory controller 1230 may control transfers of data or instructions to and from the memory 1220. In some embodiments, the memory controller 1230 may be provided as a separate chip from the processor 1210. In some embodiments, the memory controller 1230 may be provided as an internal component of processor 1210.

The storage device 1240 may non-temporarily store programs and data. In some embodiments, the storage device 1240 may be implemented as a non-volatile memory. The communication interface 1250 may support wired or wireless Internet communication of the computing device 1200. In addition, the communication interface 1250 may support various communication methods other than Internet communication. The bus 1260 may provide a communication function between the components of the computing device 1200. The bus 1260 may include at least one type of bus according to a communication protocol between the components.

In some embodiments, each of the components, elements, modules, or units represented by a block as illustrated in FIG. 1 to FIG. 11 may be implemented as various numbers of hardware, software, and/or firmware structures that execute respective functions described above, according to example embodiments. For example, at least one of these components, elements, modules, or units may include various hardware components including a digital circuit, a programmable or non-programmable logic device or array, an application specific integrated circuit (ASIC), or other circuitry using a digital circuit structure, such as a memory, a processor, a logic circuit, a look-up table, etc., that may execute the respective functions through controls of one or more microprocessors or other control apparatuses. Further, at least one of these components, elements, modules, or units may include a module, a program, or a part of code, which contains one or more executable instructions for performing specified logic functions, and executed by one or more microprocessors or other control apparatuses. Furthermore, at least one of these components, elements, modules, or units may further include or may be implemented by a processor such as a central processing unit (CPU) that performs the respective functions, a microprocessor, or the like. Functional aspects of embodiments may be implemented in algorithms that execute on one or more processors.

While the present disclosure has been described in connection with what is considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A memory device comprising:
    a memory cell array comprising a plurality of rows;
    a row decoder configured to select a row to be activated from among the plurality of rows based on a decoded row address; and
    an interface circuit configured to:
    generate the decoded row address based on decoding a plurality of bits of a row address,
    transfer the decoded row address to the row decoder,
    in a first mode of the memory device, precharge the decoded row address that is transferred to the row decoder, and
    in a second mode of the memory device, determine whether a precharge signal is received in the second mode, and precharge the decoded row address based on the precharge signal.

2. The memory device of claim 1, wherein the interface circuit is further configured to precharge the decoded row address to a predetermined level.

3. The memory device of claim 2, wherein the predetermined level is a low level.

4. The memory device of claim 1, wherein the first mode is a precharge power-down mode.

5. The memory device of claim 4, wherein the memory device is configured to generate a flag signal when the memory device enters the precharge power-down mode, and wherein the interface circuit comprises:
a control signal generating circuit configured to generate a precharge control signal in response to the flag signal in the precharge power-down mode; and
a row address latch circuit configured to precharge the decoded row address in response to the precharge control signal.

6. The memory device of claim 5, wherein the interface circuit is further configured to precharge the decoded row address at a predetermined time point of the flag signal.

7. The memory device of claim 1, wherein the interface circuit comprises:
a control signal generating circuit configured to generate a precharge control signal; and
a row address latch circuit configured to receive the precharge control signal from the control signal generating circuit and precharge the decoded row address in response to the precharge control signal.

8. The memory device of claim 1, wherein the second mode is a self-refresh mode.

9. The memory device of claim 1, wherein the interface circuit is configured to generate the decoded row address in response to a bank address indicating a memory bank from among a plurality of memory banks.

10. A memory device comprising:
a memory cell array comprising a plurality of rows;
a row decoder configured to select a row to be activated from among a plurality of rows based on a decoded row address;
a row address align circuit configured to align a plurality of bits of a row address based on an active command from a memory controller; and
a latch circuit configured to:
decode and latch the aligned row address,
transfer the decoded row address to the row decoder,
in a first mode of the memory device, precharge the decoded row address to a predetermined level in response to a precharge control signal, and
in a second mode of the memory device, determine whether a precharge signal is received in the second mode, and precharge the decoded row address based on the precharge signal.

11. The memory device of claim 10, further comprising:
a control signal generating circuit configured to generate the precharge control signal.

12. The memory device of claim 11, wherein the control signal generating circuit comprises a logic circuit configured to:
in the second mode, perform a logical operation on a flag indicating the first mode and the precharge signal, and generate the precharge control signal based on a result of the logical operation, and
wherein the logical operation is a logical OR operation between the flag and the precharge signal.

13. The memory device of claim 10, wherein the first mode is a precharge power-down mode.

14. The memory device of claim 11, wherein the control signal generating circuit comprises:
a first logic circuit configured to perform a logical AND operation on a self-refresh flag indicating the second mode and the precharge signal to generate a first output;
a pulse generating circuit configured to generate a pulse signal in response to a flag indicating the first mode; and
a second logic circuit configured to perform a logical OR operation between the first output of the first logic circuit and the pulse signal from the pulse generating circuit to generate the precharge control signal.

15. The memory device of claim 10, wherein the second mode is a self-refresh mode.

16. The memory device of claim 10, wherein the predetermined level is a low level.

17. A method of precharging a memory device including a row decoder connected to a plurality of rows, the method comprising:
generating a decoded row address by decoding a plurality of bits of a row address;
transferring the decoded row address to the row decoder;
selecting a row to be activated from among the plurality of rows based on the decoded row address;
based on the memory device being in a first mode, precharging the decoded row address to a predetermined level; and
based on the memory device being in a second mode, determining whether a precharge signal is received, and precharging the decoded row address based on the precharge signal.

18. The method of claim 17, wherein the first mode is a precharge power-down mode.

19. The method of claim 17, further comprising:
not precharging the decoded row address when the memory device is not in the second mode or the precharge signal is not received.

20. The method of claim 17, wherein the second mode is a self-refresh mode.

* * * * *